United States Patent [19]
Bly et al.

[11] Patent Number: 5,715,281
[45] Date of Patent: Feb. 3, 1998

[54] ZERO INTERMEDIATE FREQUENCY RECEIVER

[75] Inventors: Stephen Bly, deceased, late of Hunterville, New Zealand, by Dawn Adams, Administratrix; Mark Vernon Lane; William Mark Siddall, both of Christchurch, New Zealand

[73] Assignee: Tait Electronics Limited, Christchurch, New Zealand

[21] Appl. No.: 603,533

[22] Filed: Feb. 21, 1996

[30] Foreign Application Priority Data

Feb. 21, 1995 [NZ] New Zealand ............... 270535

[51] Int. Cl.$^6$ .................................................. H04L 27/06
[52] U.S. Cl. ................... 375/344; 375/373; 455/209
[58] Field of Search ............................ 375/200, 344, 375/373, 332; 455/209, 192.2, 115

[56] References Cited

U.S. PATENT DOCUMENTS

| | | | |
|---|---|---|---|
| 4,464,770 | 8/1984 | Maurer et al. | |
| 4,484,355 | 11/1984 | Henke et al. | |
| 4,837,853 | 6/1989 | Heck. | |
| 5,003,621 | 3/1991 | Gailos | 455/209 |
| 5,263,194 | 11/1993 | Ragan. | |
| 5,276,706 | 1/1994 | Critchlow. | |
| 5,365,185 | 11/1994 | Bar-David | 329/308 |
| 5,438,591 | 8/1995 | Oie et al. | 375/261 |
| 5,440,587 | 8/1995 | Ishikawa et al. | 375/332 |
| 5,487,186 | 1/1996 | Scarpa | 455/192.2 |
| 5,500,878 | 3/1996 | Iwasaki | 375/344 |
| 5,504,785 | 4/1996 | Becker et al. | 375/344 |
| 5,528,633 | 6/1996 | Halik et al. | 375/326 |
| 5,563,888 | 10/1996 | Parr et al. | 370/95.1 |
| 5,566,211 | 10/1996 | Choi | 375/332 |
| 5,579,338 | 11/1996 | Kojima | 375/208 |

FOREIGN PATENT DOCUMENTS

| | | |
|---|---|---|
| 0 062 872 | 10/1982 | European Pat. Off. |
| 0 474 615 | 3/1992 | European Pat. Off. |
| 2 614 155 | 10/1988 | France. |
| 2 215 544 | 9/1989 | United Kingdom. |
| WO 94/10756 | 5/1994 | WIPO. |

*Primary Examiner*—Stephen Chin
*Assistant Examiner*—Mohammad Ghayour
*Attorney, Agent, or Firm*—Panitch Schwarze Jacobs & Nadel, P.C.

[57] ABSTRACT

A zero intermediate frequency radio receiver that comprises mixing stages, an A to D converter, a digital demodulator, a carrier tracking system and a carrier nulling system is disclosed. The mixing stages receive FM or PM signals and produce analogue in-phase and quadrature baseband signal which are in turn converted to digital baseband signals by the A to D convertor. DC offsets in the baseband signals are removed by high pass filtering prior to demodulation. Tracking enables the baseband signals to be maintained at a centre frequency of substantially zero hertz, while signal strength at this frequency is minimized or nulled before the DC offset filtering. Information which might otherwise be removed by the filtering is thereby retained in the baseband signals, which are relatively less distorted.

12 Claims, 2 Drawing Sheets

ZERO INTERMEDIATE FREQUENCY RECEIVER

TECHNICAL FIELD

This invention relates to the reception of frequency modulated (FM) or phase modulated (PM) radio signals, and particularly to a radio receiver having a zero hertz centre frequency at the final stage of intermediate frequency (IF) processing. The receiver may be used in a land based mobile radio system.

Most mobile radio systems in use today employ frequency modulation, frequency shift keying or phase shift keying technique, for imparting information to a radio frequency (RF) carrier. All of the modulation information has these systems is contained in the instantaneous phase or frequency of the carrier signal.

BACKGROUND

A typical zero-IF receiver converts an RF signal into a zero-IF or baseband signal by shifting the received signal downward by an mount equal, or virtually equal, to that of the carrier frequency. Relatively simple low pass filters may then be used to receive RF signals in both narrowband and wideband FM or PM radio systems.

The downconversion process is implemented in one of more analogue mixing stages. normally denoted by the order of the conversion. For example, the receiver with three mixing stages would be called a triple conversion receiver. The baseband signal is then digitally processed to recover the modulation information.

Direct conversion receivers suffer from DC offset errors introduced by the baseband analogue sections of the receiver. These offsets can be many times larger than the smallest signal that must be detected, and cause undesirable effects such as descnsing of the receiver.

The standard correction, well understood by those skilled in the art, is to use special circuits to remove the DC offsets from the baseband signal. These circuits are normally high pass filters with transmission zero at DC and a half power point of several Hz. An unfortunate side effect of the filtering is that information from the received signal can be removed as well, and may result in distortion of the demodulated signal.

One approach to overcoming the side effects of DC offset removal has been disclosed in U.S. Pat. No. 5,003,621. This describes a dual conversion FM receiver that uses a phase-lock-loop with a small frequency offset to minimise the effects of filtering on a received modulation. By applying a small frequency offset the band of frequencies that are removed by the DC correction are translated into a region of the received spectrum where significant information is least likely to be present.

SUMMARY OF THE INVENTION

It is an object of the present invention to provide an alternative zero-IF receiver in which the carrier component of the zero-IF signal is minimised, so that the effects of DC offset connection are in turn reduced.

This object is met by a receiver which operates as disclosed herein. The receiver includes a mixer having at east one local oscillator which shifts received FM or PM signals to analogue baseband signals, an analogue to digital converter, and a demodulator, these being generally standard components.

The receiver also includes components which track and adjust the baseband signals to ensure that a centre frequency of sufficiently close to zero hertz is maintained, and which and modulate the mixer to null or substantially minimise the signal strength at the centre frequency. This enables DC offset errors to be corrected without loss of significant low frequency information.

Various alternative systems for tracking and hulling are disclosed. In one preferred embodiment, signals derived from the demodulator are used to track and/or null the centre frequency. In another embodiment, the centre frequency is tracked by measuring the power which is distributed between the in-phase and quadrature baseband signals. Signal strength at the centre frequency may be minimised in this embodiment by modulating the mixer with a directly generated low frequency signal.

Alternative combinations of the tracking d nulling systems from either of these embodiments, or other possible embodiments, may also be implemented.

BRIEF DESCRIPTION OF THE DRAWINGS

Two preferred embodiments of the invention will be described with reference to the accompanying drawings, of which FIG. 1 show a zero-IF receiver having carrier tracking and nulling loops.

DETAILED DESCRIPTION OF THE PREFERRED EMBODIMENTS

Figure 1:
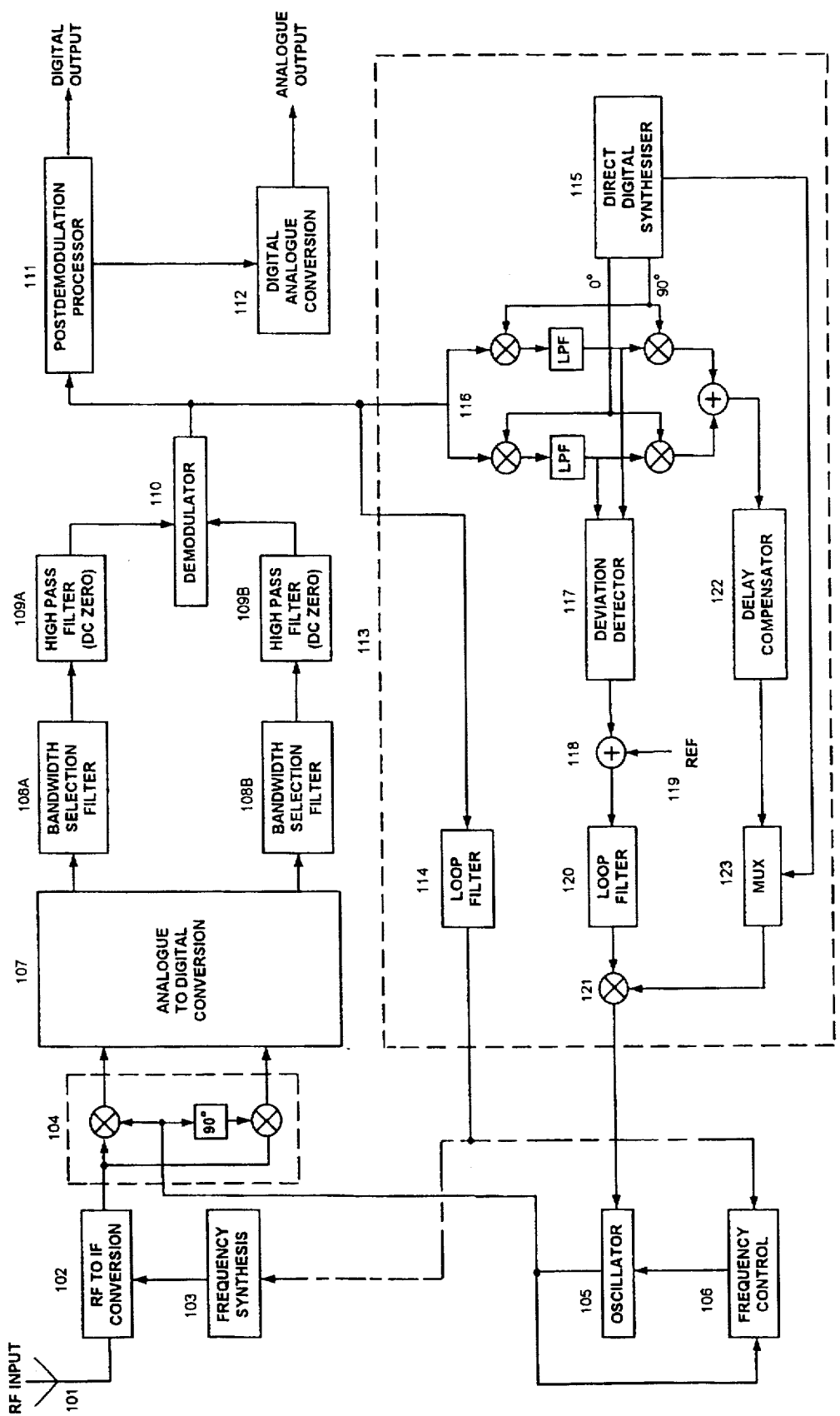

FIG. 1 illustrates a zero-IF receiver according to the invention. RF signals having frequency or phase modulation are received by an antenna 101 and downconverted to a non-zero-IF by the conversion stages 102. There may be one or several frequency translation or mixing stages. Each stage is fed by n appropriate frequency source indicated as synthesizer 103. Some bandpass filtering takes place in the RF to IF conversion stages to select a required channel and attenuate image responses resulting from the mixing. The process of RF to non-zero-IF conversion is well understood and does not warrant further discussion.

The non-zero-IF to zero-IF conversion stage 104 consists of in-phase and quadrature mixers that produce in-phase and quadrature baseband signals respectively. These mixers are driven by an oscillator 105 whose carrier frequency is maintained at the centre frequency of the non-zero-IF signal by a controller 106. The baseband analogue signals are converted to digital signals by the analogue-to-digital converter 107, and an appropriate bandwidth may be selected by the digital selection filters 108A and 108B. The cutoff frequency of these filters is readily adjusted to accommodate various channel spacings in mobile radio systems, commonly 12.5, 20 and 25 kHz.

The analogue mixing stages introduce unwanted DC offsets and low frequency excess noise (1/f noise) to the baseband signals. These unwanted components removed by digital high pass filter 109A and 109B. Each filter has a transmission zero at DC and effectively provides infinite attenuation of the DC component of the baseband signal.

The FM or PM information is detected by a frequency or phase demodulator 110 which passes output to a post-demodulation processor 111 and to the carrier frequency tracking and nulling loops 113. A low pass filter may precede the loops 113 to remove audible frequencies and allow sampling rates in tho loops to be lowered. The carrier frequency tracking loop through filter 114 uses the low frequency modulation information to maintain the centre frequency of the downconverted RF signal at precisely zero hertz. The carrier nulling loop through scaler 121 modulates oscillator 105 so that the carrier component of the zero-IF signal is minimized.

The post demodulation processor 111 performs signal processing functions appropriate to FM or PM mobile radio systems, such as de-emphasis filtering or signal decryption. Speech band information from the processor may be converted to a signal for audible output by the digital-to-analogue convertor 112. The post-demodulation processor 111 may also supply digital output to other parts of the receiver 100.

The carrier frequency tracking loop consists of loop filter 114 which uses modulation information from the demodulator 110 to adjust the frequency synthesizer 103 and/or the oscillator 105 via controller 106. This modulation information is typically a DC (and low frequency) component that is produced by the demodulation process, proportional to the intermediate frequency offset from zero. The control paths from the loop filter 114 to the frequency synthesizer 103 and controller 106 are shown in dashed lines as one or both paths may be used. Overall the carrier frequency of the zero-IF signal which is passed to the analogue to digital convertor 107 is maintained at zero hertz.

The carrier nulling loop consists of a direct digital sine wave synthesizer 115, tunable bandpass filter 116, deviation detector 117, reference comparator 118, reference signal 119, loop filter 120, scaler 121, delay compensator 122 and signal multiplexer 123. The loop operates in two modes denoted A or B. Mode A is enabled in the receiver when the RF input signal contain CTCSS information, being a continuous tone at one of 37 standard frequencies in the range 67 to 250.3 Hz. Mode B is enabled when the RF signal does not contain CTCSS information.

On enabling mode A, CTCSS information is selected by the tunable bandpass filter 116, which has a bandwidth of several tens of hertz and a centre frequency adjusted to equal one of the standard CTCSS frequencies. The centre frequency my be predicted from information stored in the receiver or may be supplied by a non-predictive CTCSS detector in the processor 111, and is set by the digital synthesizer 115.

The direct digital synthesizer 115 produces a quadrature pair of sine waves at the appropriate CTCSS frequency which are fed into the enable bandpass filter 116. The filter serves two functions, one being to obtain a relatively noise free estimate of the received CTCSS frequency. The other is to provide the deviation detector 117 with the in-phase and quadrature components of the difference frequency between the standard CTCSS, frequency generated by the synthesizer 115, and the received CTCSS frequency from demodulator 110. Normally the maximum difference would be less than 0.5% of the standard frequency.

The turnable bandpass filter 116 is shown as a Weaver modulator but a range of other circuits might be used. Operation of the modulator is explained in "A Third Method of Generation and Detection of Single-Sideband Signals" D K Weaver Jr. Proc. IRE, Dec. 1956, and is well understood in the art. See also U.S. Pat. No. 2,928,055.

The detector 117 estimates the frequency deviation of the received CTCSS tone in the frequency spectrum by computing the amplitude of the phasor represented by the in-phase and quadrature components of the difference frequency signal from filter 116. Demodulator 110 operates digitally with exactly known amplitude versus frequency characteristics-so that the amplitude of the signal from detector 117 give a precise measure of the frequency deviation.

The deviation comparator 118 then subtracts the measured frequency deviation from a reference deviation signal 119. The reference is empirically chosen so that when the measured CTCSS deviation equals the reference deviation the carrier component of the zero-IF signal is minimized and the output of comparator 118 is zero. The amplitude of the carrier component is proportional to the value of the zeroth order Bessel function of the first kind at the measured frequency deviation. The zeros of this Bessel function occur at deviations of 2.405, 5.52, 8.655 and so on, according to standard tables. When the CTCSS deviation provides a modulation index having one of these values the carrier component of the received CTCSS signal will be zero.

Loop filter 120 integrates the output of comparator 118 and passes a multiplicative constant to the scaler 121. The delay compensator 122 is programmable to be adjusted so that the overall delay from downconversion mixers 104 to the oscillator 105 via components 107 to 110, and 116 to 121, is an integral number of CTCSS tone periods. Output from the compensator 122 is passed to the multiplexer 123 and multiplied by the constant from loop filter 120 m the scaler 121. The programmable delay is included so that the modulated oscillator 105 is in phase with the received CTCSS modulated signal presented to the mixers 104, to enhance loop stability by maximising the phase margin.

In mode A, the overall effect of the carrier nulling loop is therefore to modify the modulation index of the received CTCSS modulated signal by frequency modulating the oscillator 105 with a suitably filtered, scaled and time shifted version of the received signal. The eventual signal presented to mixer 104 is thereby specifically adjusted to minimise the carrier component of the received signal. This carrier component would normally be attenuated by filters 109 that are required to remove low frequency noise and DC offset errors, resulting in distortion of the demodulated signal and desensing of the receiver through loss of information. These normally detrimental effects of the DC zero circuits are thereby reduced.

In mode B, the receiver uses a low frequency sine wave generated by the direct digital synthesizer 115 as a substitute where the received FM or PM signals contain no CTCSS. A sine wave frequency of approximately 100 Hz may be chosen. Signal multiplexer 123 then passes the output of the digital synthesizer 115 to the scaler 121, instead of the output from delay compensator 122. The deviation of this signal is then used to modulate the signal presented to mixer 104 as before. The delay compensator my be disabled.

Figure 2:
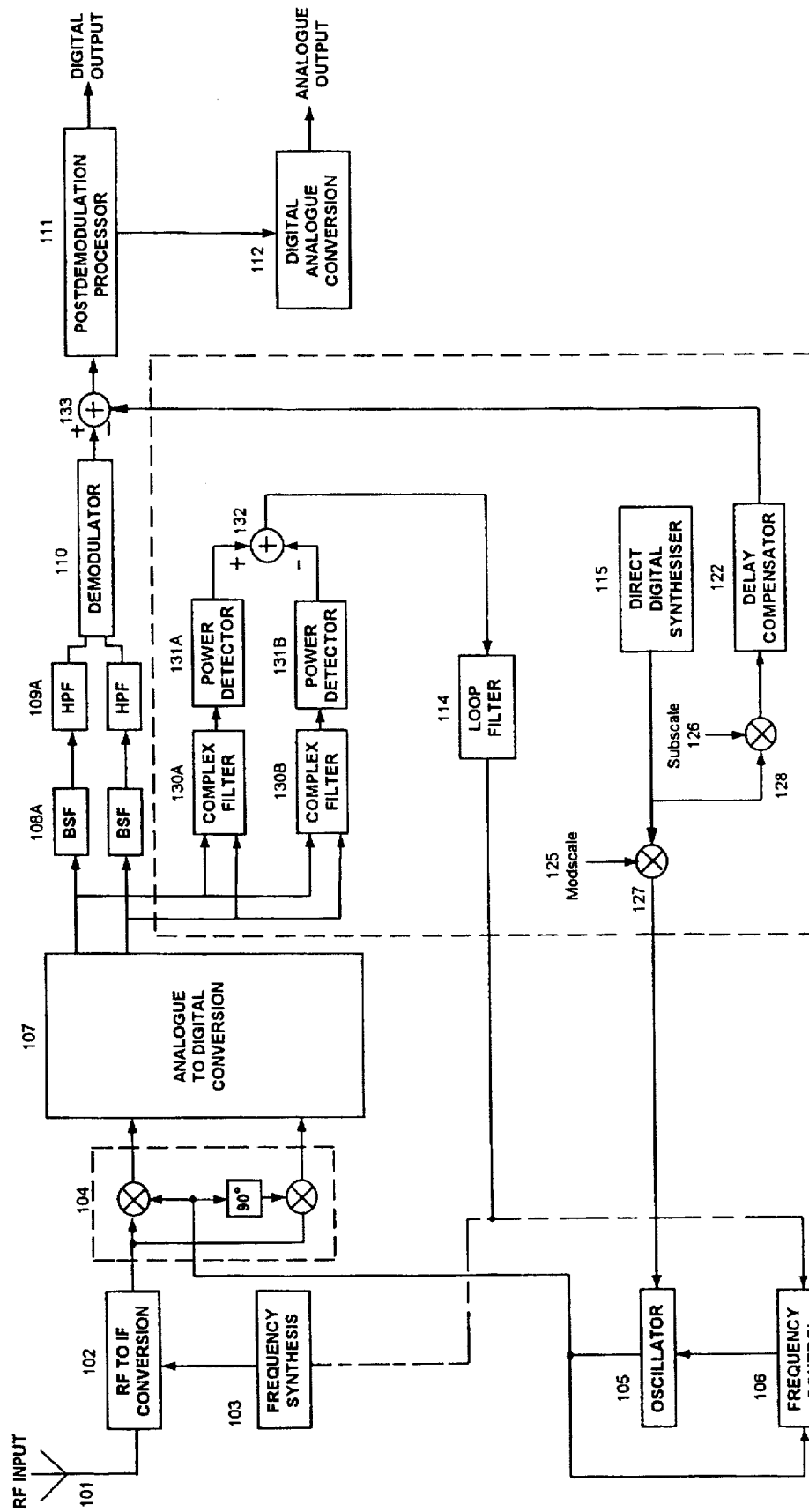
FIG. 2 shows another receiver having alternative tracking and nulling arrangements.

FIG. 2 illustrates a further zero-IF receiver according to the invention. The down conversion mixing stages 102 and 104 are generally similar to those of FIG. 1, as are the A/D 107, filtering 108, 109 and demodulation 110 systems. Only the carrier tracking and nulling components 140 ore substantially different. A combination of tracking using demodulation information as in FIG. 1, with nulling using direct generation of a low frequency signal as ha FIG. 2, would of course be possible, as would tracking according to FIG. 2 and nulling according to FIG. 1, or other combinations using a part or whole of the procedures illustrated in either FIG.

In this embodiment, carrier tracking is enabled by monitoring the power distributed between in-phase and quadrature signal components. Digital filters 130A and 130B take in-phase and quadrature signals from the analogue to digital converter 107 as shown, or possibly are coupled to th converter 107 through bandwidth selection filters 108A and 108B, and the high pass filters 109A and 109B. The two filters 130A and 130B filter the complex frequency signal to represent real and imaginary components centred about zero hertz. The output from these filters is fed into power detectors 131A and 131B respectively.

Output from the power detectors 131A and 131B represents the power distributed between the real and imaginary frequency components of the baseband signals. By taking the difference between the outputs of the power detector the level of asymmetry in the power of the received signal due to a frequency offset can be monitored. A difference signal obtained through adder 132 is then fed through loop filter 114 to be used as a control voltage for correcting the frequency of oscillator 105 or frequency synthesis ers 103.

An alternative carrier nulling loop is also shown in this FIG., consisting of a direct digital sine wave synthesiser 115, scalers 127, 128 and delay compensator 122, similar to those of FIG. 1. This method of carrier nulling operates either in the presence or absence of CTCSS or other low frequency modulation and does not require input from the demodulator 110.

The direct digital synthesiser 115 generates a low frequency sine wave which is multiplied in amplitude by a factor modscale 125, through scaler 127, and used to modulate the oscillator 105. As in FIG. 2, the amplitude of the carrier component of oscillator 105 is proportional to the value of the zeroth order Bessel function of the tint kind at the frequency deviation. Deviation of the oscillator modulation is adjusted by setting modscale 125 to reduce, the Bessel function to a zero, which occurs at deviations of 2.405, 5.52, 8.655, etc., according to standard tables.

If desired this additional tone which will be present at the output of the frequency demodulator 110 can be removed by subtracting a suitable amplitude scaled and delayed version of the signal from synthesiser 115. The additional signal is thus scaled by subscale 126 through scaler 128, and delayed by compensator 122 before king subtracted by adder 133 from the output of the demodulator 110. Removal of the additional tone will not necessarily be required.

Receive for modulated RF signals have been described. Conversion of these signals to baseband through analogue mixing stages introduces DC offset errors which are removed by appropriate filters prior to demodulation. Carrier tracking and nulling according to the invention can be used to avoid a corresponding removal of low frequency signal information.

We claim:

1. A zero intermediate frequency radio receiver for recovering modulation information from received frequency or phase modulated signals, comprising:
   mixing means which mix the received signals with at least one local oscillator to produce in-phase and quadrature analogue baseband signals,
   analogue to digitial (A/D) means coupled to the mixing means, which convert the analogue baseband signals into digital baseband signals.
   demodulation means coupled to the A/D means, which digitally demodulate and filter the digital baseband signals to produce digital modulation information,
   carrier tracking means, which adjusts the mixing means to maintain the analogue baseband signals at a centre frequency of substantially zero hertz, and
   carrier nulling means, which adjusts the mixing means to substantially minimise signal strength at the centre frequency of the analogue baseband signals.

2. A receiver according to claim 1 wherein the carrier tracking means is coupled to the demodualation means and adjusts the mixing means using a portion of the demodulation information.

3. A receiver according to claim 1 wherein the carrier nulling means is coupled to the demodulation means and adjusts the mixing means with a portion of the demodulation information.

4. A receiver according to claim 1 wherein the carrier tracking means is coupled to the A/D means and adjusts the mixing means according to power measurements of the in-phase and quadrature baseband signals.

5. A receiver according to claim 1 which the carrier nulling means generates a low frequency signal which modulates the mixing means.

6. A method for receiving frequency or phase modulated signals and recovering modulation information, comprising;
   mixing the received signals with at least one local oscillator to produce in-phase and quadrature baseband signals,
   converting the analogue baseband signals into digital baseband signals,
   demodulating the digital baseband signals to produce digital modulation information,
   adjusting the mixing means to maintain the analogue baseband signals at a centre frequency of substantially zero hertz, and
   adjusting the mixing means to substantially minimise signal strength at the centre frequency of the analougue baseband signals.

7. A method according to claim 6 further comprising modulating the mixing means with a portion of the modulation information to maintain the centre frequency at zero hertz and minimise signal strength at the centre frequency.

8. A method according to claim 6 further comprising monitoring power in the in-phase and quadrature baseband signals to maintain the centre frequency at substantially zero hertz.

9. A method according to claim 6 further comprising generating an additional signal which modulates the mixing means and thereby minimises signal strength at the centre frequency.

10. A method for receiving frequency or phase modulated signals and recovering modulation information, the method comprising the steps of:
    mixing the received signals with at least one local oscillator to produce in-phase and quadrature baseband analog signals;
    converting the analog baseband signals into digital baseband signals;
    adjusting the mixed signals to maintain the analog baseband signals at a center frequency of substantially zero Hertz;
    adjusting the mixed signals to substantially minimize signal strength at the center frequency of the analog baseband signals;
    generating an additional signal which modulates the mixed signals and thereby minimizes signal strength at the center frequency;
    demodulating the digital baseband signals to produce digital modulation information; and
    removing the additional signal following demodulation of the digital baseband signals.

11. The method of claim 10 further comprising the step of modulating the mixed signals with a portion of the modulation information to maintain the center frequency at substantially zero Hertz and minimize signal strength at the center frequency.

12. The method of claim 10 further comprising the step of monitoring power in the in-phase and quadrature baseband signals to maintain the center frequency at substantially zero Hertz.

* * * * *